United States Patent [19]

Bacrania et al.

[11] Patent Number: 4,982,194

[45] Date of Patent: Jan. 1, 1991

[54] BACK-SAMPLING CHARGE REDISTRIBUTION ANALOG TO DIGITAL CONVERTER

[75] Inventors: Kantilal Bacrania; Chong I. Chi, both of Palm Bay, Fla.

[73] Assignee: Harris Corporation, Melbourne, Fla.

[21] Appl. No.: 340,705

[22] Filed: Apr. 20, 1989

[51] Int. Cl.$^5$ .............................................. H03M 1/38
[52] U.S. Cl. ..................................... 341/172; 341/161
[58] Field of Search ............... 341/122, 150, 155, 157, 341/161, 162, 153, 172

[56] References Cited

U.S. PATENT DOCUMENTS

| | | | |
|---|---|---|---|
| 4,129,863 | 12/1978 | Gray et al. | 341/172 |
| 4,200,863 | 4/1980 | Hodges et al. | 341/172 |
| 4,282,515 | 8/1981 | Patterson, III | 341/118 |
| 4,388,612 | 6/1983 | Takagi et al. | 341/150 |
| 4,531,113 | 7/1985 | Abraham | 341/172 |
| 4,618,852 | 11/1986 | Kelley et al. | 341/172 |
| 4,641,130 | 2/1987 | Mastroianni | 341/172 |

OTHER PUBLICATIONS

"All-MOS Charge Redistribution Analog-to-Digital Conversion Techniques-Part 1", McCreary et al., IEEE, Solid State Circuits, vol. SC-10, pp. 371-379, Dec. 1975.

*Primary Examiner*—Bernard Roskoski
*Assistant Examiner*—H. L. Williams
*Attorney, Agent, or Firm*—Barnes & Thornburg

[57] ABSTRACT

Aperture delay and jitter are reduced when the sequence of operation of a charge redistribution analog to digital converter is arranged so that signal acquisition occurs in the idle time of the converter. Conversion begins by terminating the acquisition or sample phase immediately upon receipt of the start conversion command. Approximation begins directly thereafter. Upon completion of the successive approximation conversion phase and latching the result the capacitor array is discharged. The comparator offset is sampled and held and the acquisition phase is initiated and continues until receipt or occurrence of the next start conversion command.

16 Claims, 4 Drawing Sheets

BACK-SAMPLING CHARGE REDISTRIBUTION ANALOG TO DIGITAL CONVERTER

BACKGROUND AND SUMMARY OF THE INVENTION

The present invention relates generally to analog to digital converters, and more specifically to an improvement in charge redistribution analog to digital converters.

Analog to digital converters include three distinctive phases of a cycled operation, namely an adjustment phase for offset or gain, an input acquisition phase, and a conversion phase. These phases are described specifically in Raymond B. Patterson, III U.S. Pat. No. 4,282,515. Analog to digital converters using charge redistribution techniques provide an inherent sample-and-hold function for acquisition as well as offset adjustment or cancellation. Such a system is described in an article "All-MOS Charge Redistribution Analog-to-Digital Conversion Techniques—Part 1", J. McCreary and P. Gray, IEEE, J. Solid State Circuits, vol. Sc-10, pp. 371-379, December 1975. A block diagram of an analog-to-digital converter is illustrated in FIG. 1 as including, for example, an eight-bit successive approximation register, a current controlled oscillator and timing generator, an eight-bit weighted capacitor array constituting a digital-to-analog converter, high speed analog comparator, and a latch. Input and output buffers are included to provide digital inputs and outputs. A controller is provided which receives the input analog signal $V_{IN}$, a reference signal $V_{REF}$, an analog ground and a start conversion command signal SC, which may be a digital-or-analog input signal. The controller controls the circuity of FIG. 1 to produce the sequence illustrated in the graphs of FIG. 2.

As illustrated in FIG. 2, upon receipt of the start command signal SC the capacitors of the array are discharged by connecting both terminals to ground in response to a discharge signal DC. Upon completion of the discharging of the capacitive array, which takes approximately 100 nanoseconds, after which acquisition cycle begins. After a settling time of approximately 100-200 nanoseconds, allowing for the transient loading effects, the offset cancellation of the comparator begins and is illustrated by the pulse SO. This is the first phase of the circuits adjustment and compensation as described above.

The acquisition cycle, illustrated by the signal ACQ, lasts approximately 700 nanoseconds and begins with the sampling of the comparator offset. Only after acquisition of an analog input signal, provided as an input to the capacitor array, has been completed, can the successive approximation portion of the cycle or conversion begin. The successive approximation cycle is represented by the eight cycles of SAR for the eight-bit successive approximation register and takes approximately 1 microsecond. Upon termination of the successive approximation routine, the digital value is fixed by latching, illustrated by the LATCH signal in the graphs of FIG. 2.

The elapsed time between the start conversion command SC and the beginning of the successive approximation routine SAR, is approximately 1.1 microseconds. This is an aperture delay defined as the time lag between the start conversion command and the instant when the input is actually held on the capacitor array. With internal timing generation, it is not apparent to the user when the sampling of the input signal is completed and the exact instance when the conversion starts. This sequence makes the converter unsuitable for digital signal processing applications, where the instance at which the input is sampled is very important.

Also aperture jitter, defined as the uncertainty in time between the hold or termination of acquisition command and the instant the analog input is actually disconnected from the capacitor array, is important. In prior art methods, this signal is internally generated by a ramp and a comparator and the aperature jitter is in the range of 10 to 100 nanoseconds.

Thus, it is an object of the present invention to provide an analog-to-digital converter using charge redistribution which is suitable for digital signal processing applications.

Another object of the present invention is to provide a analog-to-digital converter using charge redistribution with reduced aperture delay and aperture jitter.

These and other objects of the invention are achieved by terminating the acquisition phase of the analog input signal and immediately starting the successive approximation conversion phase upon receipt of a start conversion command signal. Upon the completion of the successive approximation conversion phase, the result is fixed by latching. This is followed by the discharge of the capacitor array and initiation of the acquisition phase and of sample-and-holding or cancelling for the comparator offset. The acquisition phase begins at the termination of the discharge of the capacitor array, and continues until the receipt or occurrence of the next start conversion command. Thus, the present invention reduces the aperture jitter and aperture delay to substantially zero and performs the discharge, offset correction and acquisition phase after the termination of the conversion phase and will be referred to as the "back-sampling" technique. Initiating the successive approximation conversion phase using the start conversion command signal reduces aperture jitter.

Other objects, advantages and novel features of the present invention will become apparent from the following detailed description of the invention when considered in conjunction with the accompanying drawings.

DETAILED DESCRIPTION OF THE DRAWINGS

Figure 3:
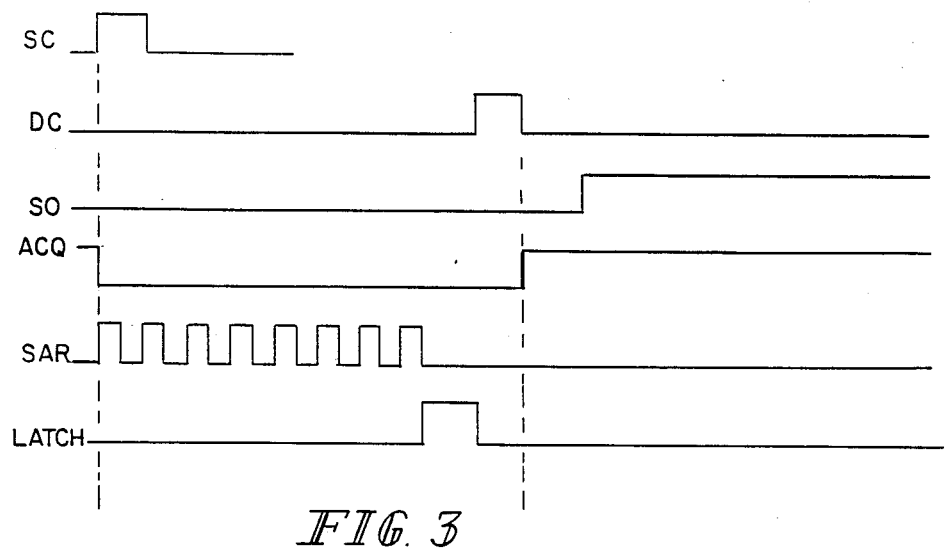
FIG. 3 is a series of graphs of signals illustrating the sequence of operation of an analog-to-digital converter incorporating the principles of the present invention.

The operation of the analog-to-digital converter using charge redistribution of a capacitive array is illustrated in the sequence of the graphs of FIG. 3. Upon the occurrence of a start command signal SC, the acquisition phase ACQ is terminated and the successive approximation routine SAR is initiated. Eight cycles for eight bits are performed. At the end of the conversion or the successive approximation routine, the final digital value is fixed by a latch, illustrated by the latch signal LATCH. After the final digital value has been fixed by the latch, the capacitors of the capacitive array are discharged by the signal DC. This is followed by the acquisition phase which begins with the acquisition signal ACQ. Upon an appropriate settling time allowing for the transient loading effects, the sampling of the offset of the comparator as represented by the signal SO begins.

With this back sampling technique, the aperature delay has been reduced to the aperature jitter. Since this technique requires previous cycles for the aquisition phase, the first cycle at power up will be discarded. The loss of a cycle is a small price to pay for minimizing aperature delay and jitter. By using the externally generated start command signal, instead of an internally generated ramp signal, aperture jitter is substantially reduced.

Figure 1:
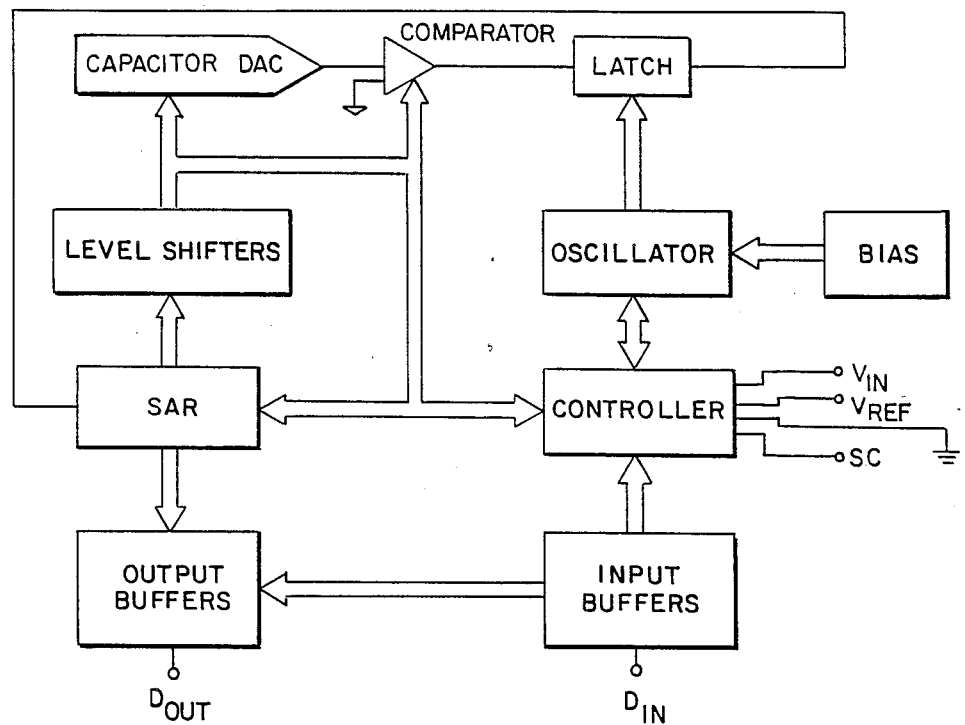
FIG. 1 is a block diagram of a analog-to-digital converter of the prior art.
Figure 2:
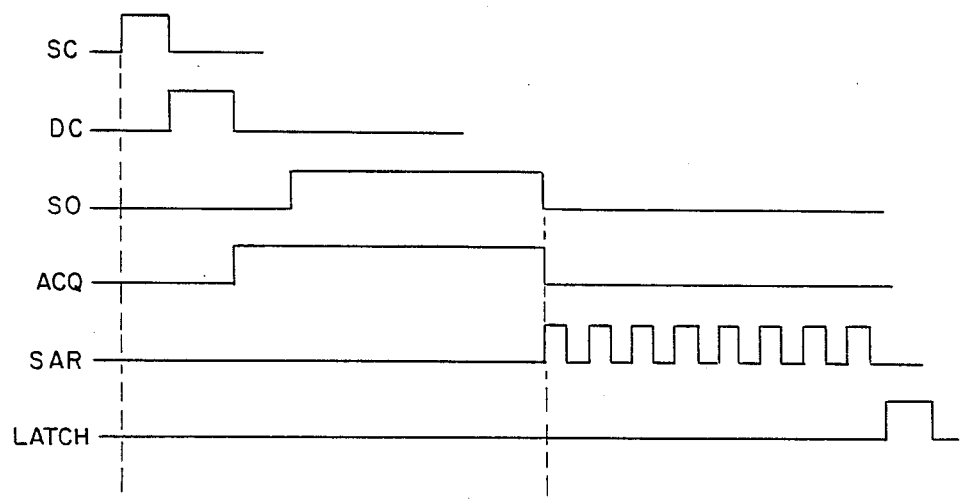
FIG. 2 is a series of graphs of signals displaying the sequence of operation of an analog-to-digital converter of the prior art.

The period of time of the different signals in FIG. 3 are the same as that of FIG. 2, with the exception of the acquisition signal ACQ. The discharge signal is approximately 100 nanoseconds, the sampling of the offset of the comparator is approximately 700 nanoseconds, and the successive approximation routine takes approximately 1 microsecond. Since the acquisition is conducted after the conversion or successive approximation routine, and is before the next start conversion command, it begins at the termination of the capacitor array discharge and continues until the next start conversion command signal. With an eight-bit analog-to-digital conversion time of approximately 1 microsecond, and a discharge, sample and offset and acquisition of approximately 1 microsecond, a two microsecond throughput rate can be produced with the present invention. In fabricated devices, an aperture jitter of less than 1 nanosecond has been measured.

FIGS. 4–11 illustrate the capacitive array with appropriate switches in the various conditions illustrating the sequence of operation according to the present invention. A first switch SW1 connects the input terminal of the capacitor array between the analog input signal $V_{IN}$ and a reference signal $V_{REF}$. The capacitor array consists of binarily weighted capacitors plus one additional capacitor of a weight corresponding to the capacitor array's least significant bit LSB. A first terminal of each capacitor is connected to the input terminal of the array or to an analog ground by individually controllable switches SW2. The second terminal of each capacitor is connected together to a output terminal of the array which is connected as an input to the comparator. A switch SW3 connects the output terminal of the array and the second terminal of the individual capacitors to an analog ground. A feedback switch SW4 connects the output of the comparator to its input.

Figure 4:
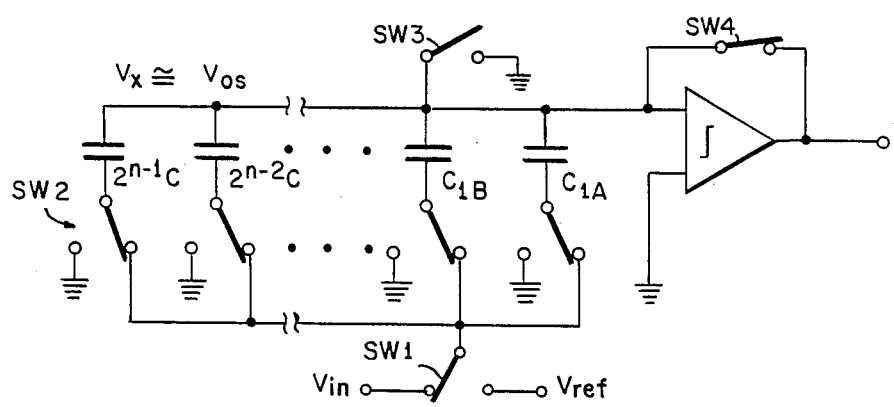
FIGS. 4-11 are schematics of the capacitive array, comparator and appropriate switches which illustrate the sequence of operation according to the principles of the present invention.

Just prior to the beginning of a cycle, as illustrated in FIG. 4, switch SW1 connects the analog input $V_{IN}$ to the capacitor array with each of the first terminal's capacitors being connected to the array input by their switches SW2. Switch SW3 is opened and the feedback switch SW4 is closed. The input signal $V_{IN}$ is charging the first or lower plate of the capacitors with the top plate of the capacitors having an offset value $V_{OS}$ applied thereto from previous cycles.

Figure 5:
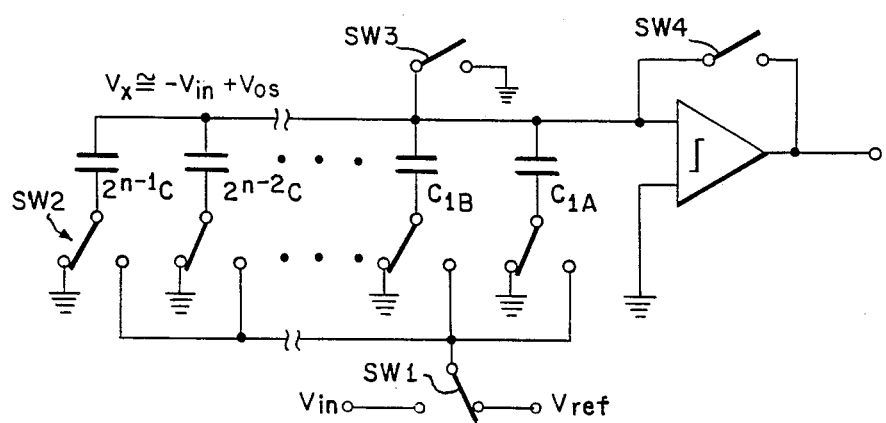

Upon receipt of a start command signal SC, switch SW1 disconnects the analog input from the input terminal of the capacitor array and connects the input terminal of the capacitor array to the reference voltage $V_{REF}$. Simultaneously, switch SW2 connects the first terminal of the capacitors to ground terminating the acquisition mode and holding the input signal thereon. This causes the signal on the output or second terminal of the array $V_X$ to be equal to the offset voltage $V_{OS}$ minus the acquired analog signal $V_{IN}$. The feedback on the comparator is disconnected by opening a switch SW4. This switching and ultimate state is illustrated in FIG. 5.

Figure 6:
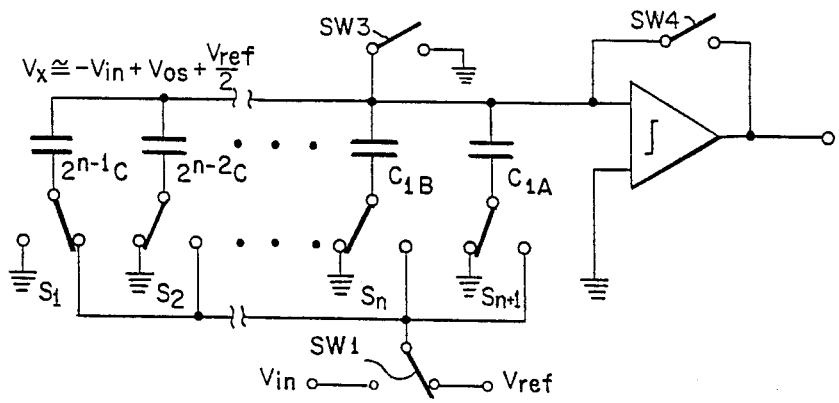

The successive approximation begins or the redistribution mode is entered as illustrated in FIG. 6 by testing the value of the most significant bit. This is accomplished by raising the bottom plate of the largest capacitor to the reference signal $V_{REF}$. This is accomplished by closing switch S1 of array switches SW2. The equivalent circuit is now actually a voltage divider between the two equal capacitance. The top plate voltage $V_X$ is increased by one half the voltage reference $V_{REF}$ and as a result of this operation:

$$V_X = -V_{IN} + V_{OS} + \frac{V_{REF}}{2}$$

The control circuitry, by sensing the sign and magnitude of $V_X$, begins the successive approximation.

If $V_X$ is less than $V_{OS}$, then $V_{IN}$ is greater than $V_{REF}/2$, and thus the most significant bit should be set equal to 1. If $V_X$ is greater than $V_{OS}$, then $V_{IN}$ is less than $V_{REF}/2$, and therefore the most significant bit would be set to 0. For a logic 1, switch S1 is left connected to $V_{REF}$ and for a logic 0, switch S1 is reconnected back to ground.

Figure 7:
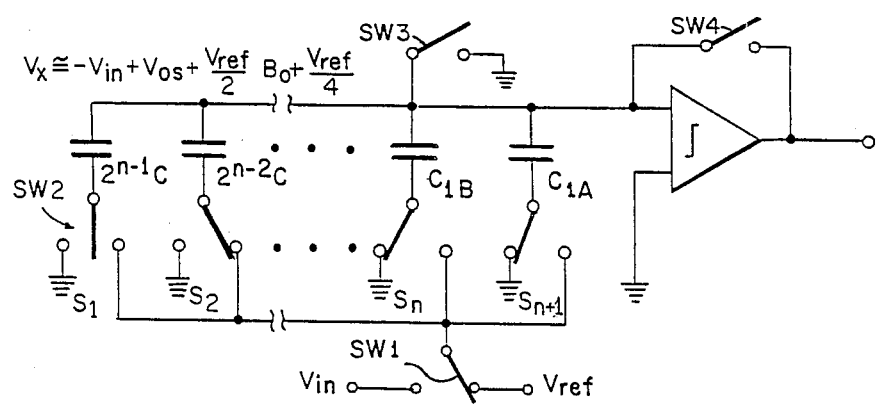

For the second most significant bit, as illustrated in FIG. 7, the second switch S2 of the array switch SW2 is connected to $V_{REF}$ raising the bottom plate of the next largest capacitor to $V_{REF}$. This results in:

$$V_X = -V_{IN} + V_{OS} + \frac{V_{REF}}{2} B_0 + \frac{V_{REF}}{4}$$

The open and closed position of switch S2 is a function of whether a logic 1 or 0 results.

Figure 8:
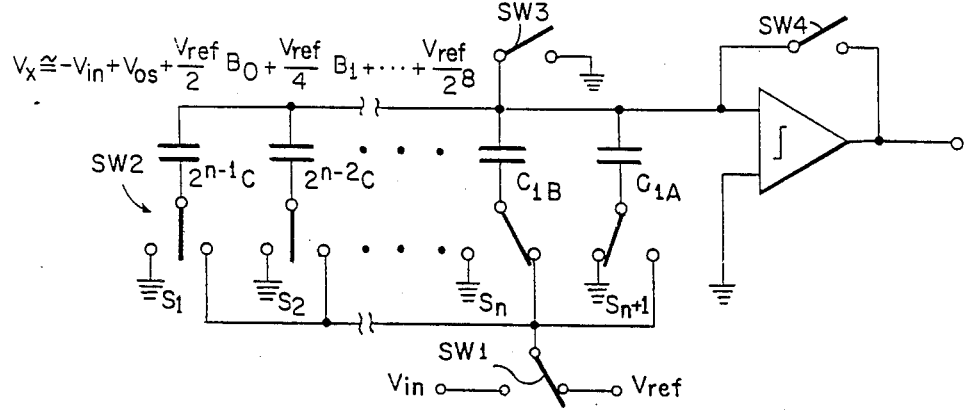

At the end of the internal conversion or successive approximation routine, the top plate voltage can be expressed by:

$$V_X = -V_{IN} + V_{OS} + \frac{V_{REF}}{2} B_0 + \frac{V_{REF}}{4} B_1 + \ldots \frac{V_{REF}}{2^8}$$

as illustrated in FIG. 8. The dual-headed arrows in FIGS. 7 and 8 indicate that the position of the switch is a function of the logic termination.

Figure 9:
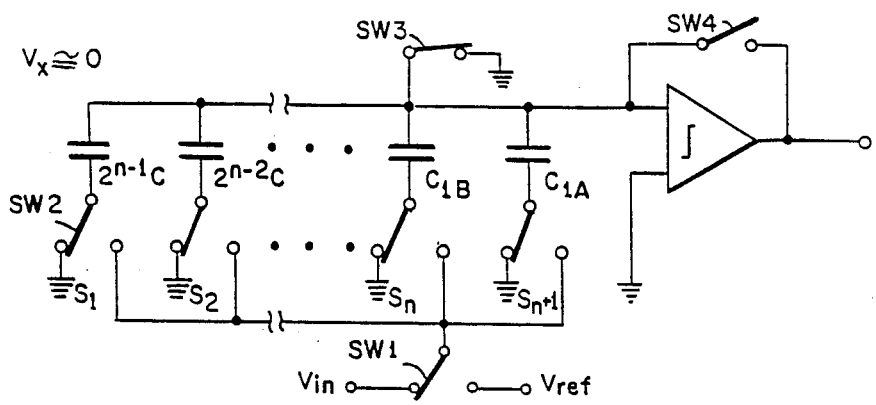

Upon completion of the successive approximation routine or conversion, the final digital value of the analog input is fixed by a latch and outputted if desired. Upon completion of the latching, the capacitor array is discharged as illustrated in FIG. 9 by connecting both plates of the capacitor to ground. SW1 disconnects the array input terminal from the $V_{REF}$ and connects it to $V_{IN}$. The switches SW2 disconnects the first terminal of each of the capacitor from the array's input terminal and connects them to ground, while switch SW3 is closed connecting the other terminal to ground. This completely discharges the capacitors of the capacitor array.

Although the analog input signal $V_{IN}$ is not being transmitted or stored on the capacitor array, the input to the capacitor array is connected to the input terminal and therefore, any time lost due to changing the position of switch SW1 is not involved in the acquisition portion of the cycle.

Figure 10:
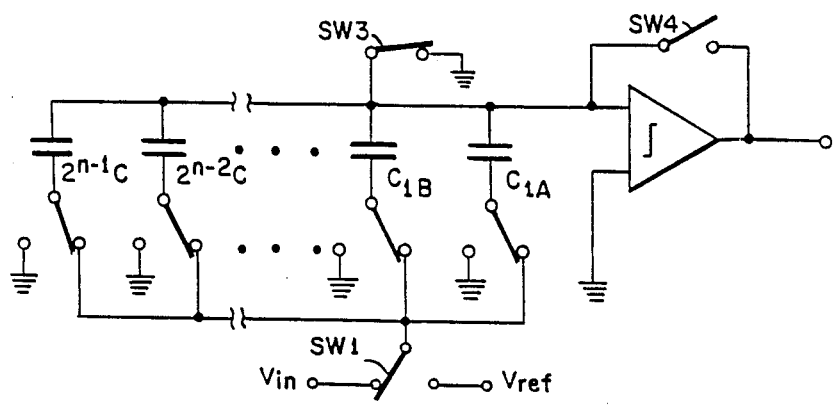

As shown in FIG. 10, switch SW2 disconnects the first terminal of capacitors from the ground and connects them to the input terminal of the array or $V_{IN}$. This constitutes the initiation of the acquisition, wherein the input signal is provided through switch SW1, the input to the capacitor array and the switches SW2 to the first terminal of each of the capacitors. The analog-to-digital converter is now in the acquisition phase and awaiting the receipt of the next start command signal, which will begin the cycle immediately with the successive approximation routine.

Figure 11:
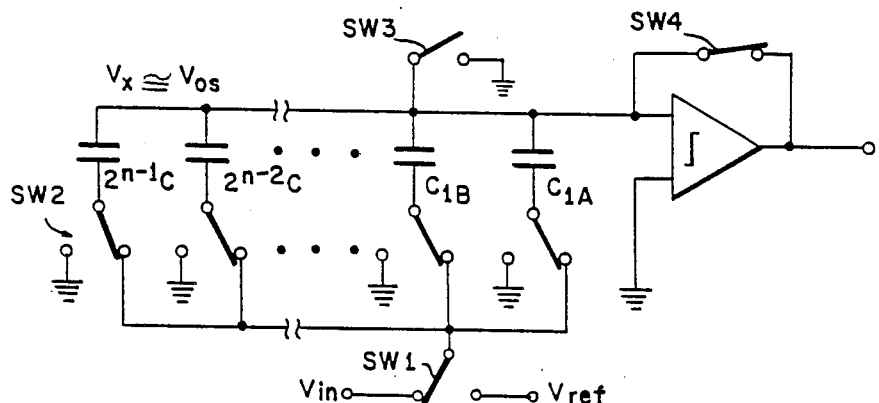

The offset of the comparator is measured or sampled as illustrated in FIG. 10, by closing switch SW3. This connects both input terminals of the comparator to ground. This offset voltage is held by opening switch SW3 and closing feedback switch SW4 on the comparator such that the top plate of the capacitor or the output terminal of the capacitor array $V_X$ is set equal to the offset $V_{OS}$, as illustrated in FIG. 11.

Thus, it can be seen that by changing the sequence of operation, the aperture delay and aperture jitter are substantially reduced. The input analog voltage is disconnected terminating the acquisition cycle immediately upon receipt of the start conversion command. Similarly, the input to the capacitive array is switched back to the analog input port upon completion of the successive approximation such that the input circuitry can track the analog input. This occurs even through the switches SW2 are being changed to discharge the capacitive array.

By using the external start conversion command signal instead of an internal signal generated by a ramp and comparator, the aperture jitter for the conversion cycle is substantially reduced. Also, by removing the other signals from the aperture window, aperture jitter does not accumulate before the conversion as in the prior art. The other signal DC, SO, SAR and latch are generated using a ramp and comparator, but have no detrimental effect, since they are outside the conversion.

If the offset of the comparator need not be sample and held each cycle, steps 10 and 11 can be combined or eliminated such that beginning with the discharge configuration of FIG. 9, switch SW3 would be open, switch SW4 would be closed and switches SW2 would disconnect the first terminal of each of the capacitors from ground and connect it to the input terminal of the capacitor array resulting in the configuration of FIG. 4. Although switches have been schematically shown in FIG. 4-11, it is understood that these may be mechanical switches, electromechanical switches, or preferably, transistors such that the circuit can be built as an integrated circuit.

Although the present invention has been described and illustrated in detail, it is to be clearly understood that the same is by way of illustration and example only, and is not to be taken by way of limitation. An eight-bit converter was used for purposes of illustration and other capacity or length converters may use the present invention. Also the times for the different pulse width are for examples and will vary with application and device parameters. The spirit and scope of the present invention are to be limited only by the terms of the appended claims.

We claim:

1. A method of performing analog to digital conversion using a capacitive array, comprising in sequence:
    terminating acquisition of an analog input signal upon occurrence of a start conversion command;
    successively approximating a digital value of said analog input signal using said capacitive array;
    fixing said digital value upon completion of said successive approximation;
    discharging said capacitive array; and
    initiating acquisition of an analog input signal after said discharging said capacitive array and before a leading edge of said start conversion command.

2. A method according to claim 1, including, following said discharging step, sampling and holding an offset of a comparator connected to an output of said capacitive array.

3. A method according to claim 1, wherein said approximating begins immediately after termination of acquisition.

4. A method according to claim 1, wherein upon occurrence of said start conversion command, an input of said capacitive array is disconnected from an analog signal and connected to a reference signal and a first terminal of each capacitor of said capacitive array is connected to ground.

5. A method according to claim 4, including connecting said input of said capacitive array to said analog signal from termination of said approximating step to occurrence of said start conversion command.

6. A method according to claim 5, including, following said discharging step, sampling and holding an offset of a comparator connected to an output of said capacitive array.

7. A method according to claim 1, including connecting an input of said capacitive array to said analog signal from termination of said approximating step to occurrence of said start conversion command.

8. A method according to claim 1, wherein said capacitive array is a binary weighted capacitive array.

9. In an analog to digital converter having an analog input means, a capacitive digital to analog converter means, a successive approximation register means, comparator means for comparing an analog input signal acquired by said analog input means with an analog signal converted by said converter means from a digital signal from said register means, digital output means and control means responsive to a start conversion command for controlling the sequence of acquisition of an input analog signal by said analog input means, discharging a capacitor array of said converter, successive approximation of a digital value of an acquired analog input signal by said converter, comparator and register means and outputting digital value on said digital output means, the improvement comprising said control means which in response to a start conversion command produces in sequence:
    termination of acquisition of an input analog signal by said analog input means;
    successively approximating a digital value of said acquired analog input signal by said converter, comparator and register means;
    outputting said digital value on said digital output upon completion of said successive approximation;
    discharging said capacitor array of said converter means; and initiating acquisition of an input analog signal by said analog input means after said discharging said capacitive array and before a leading edge of a start conversion command.

10. A converter according to claim 9, including offset means for determining an offset of said comparator means, and said control means activates said offset means after discharging said capacitor array.

11. A converter according to claim 9, wherein said control means initiates said successive approximation immediately after termination of acquisition.

12. A converter according to claim 9, wherein:
said analog input means includes an input port and first switch means for connecting an input terminal of said capacitor array to said input port or a reference value;
said converter means includes a second switch means for individually connecting a input terminal of each capacitor in said capacitor array to ground or to said input terminal of said capacitor array; and
said control means controls said first and second switch means to disconnect said input terminal of said capacitor array from said input port and connecting said first terminal of each of said capacitors to ground to terminate acquisition of an analog input signal.

13. A converter according to claim 12, wherein said control means controls said first and second switch means to connect said input terminal of each of said capacitor array to said reference value and selectively connecting said first terminal of said capacitor to either ground or said input terminal of said capacitor array during said successive approximation.

14. A converter according to claim 12, wherein said control means controls said first switch means to connect said input terminal of said capacitor array to said input port from termination of said successive approximation to occurrence of said start conversion command.

15. A converter according to claim 14, wherein said control means controls said second switch means to connect said first terminal of said capacitors to said input terminal of said capacitor array from termination of discharging said capacitors to termination of acquisition of said analog input signal.

16. A converter according to claim 9, wherein said capacitor array is a binary weighted capacitive array.

* * * * *